(12) United States Patent
Webster et al.

(10) Patent No.: US 6,515,269 B1
(45) Date of Patent: Feb. 4, 2003

(54) INTEGRALLY CONNECTED IMAGE SENSOR PACKAGES HAVING A WINDOW SUPPORT IN CONTACT WITH A WINDOW AND THE ACTIVE AREA

(75) Inventors: Steven Webster, Chandler, AZ (US); Tony Arellano, Metro Manila (PH); Roy Dale Hollaway, Metro Manila (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/490,717

(22) Filed: Jan. 25, 2000

(51) Int. Cl.[7] ............................................... H01L 27/00
(52) U.S. Cl. ................... 250/208.1; 250/216; 250/239; 257/434
(58) Field of Search ............................ 250/208.1, 216, 250/239; 257/434

(56) References Cited

U.S. PATENT DOCUMENTS

| | | | |
|---|---|---|---|
| 4,388,128 A | * 6/1983 | Ogawa et al. | 156/64 |
| 4,418,284 A | * 11/1983 | Ogawa et al. | 250/578 |
| 4,523,102 A | * 6/1985 | Kazufumi et al. | 250/578 |
| 5,051,802 A | 9/1991 | Prost et al. | 357/30 |
| 5,065,006 A | * 11/1991 | Nakamura et al. | 250/208.1 |
| 5,122,861 A | 6/1992 | Tamura et al. | 357/74 |
| 5,138,145 A | * 8/1992 | Nakamura et al. | 250/208.1 |
| 5,223,746 A | 6/1993 | Abe et al. | 257/678 |
| 5,289,002 A | 2/1994 | Tarn | 250/239 |
| 5,426,060 A | 6/1995 | Kawahara et al. | 437/8 |
| 5,534,725 A | 7/1996 | Hur | 257/434 |
| 5,733,382 A | 3/1998 | Hanoka | 136/251 |
| 5,753,857 A | 5/1998 | Choi | 174/52.4 |
| 5,773,323 A | 6/1998 | Hur | 438/123 |
| 5,798,557 A | 8/1998 | Salatino et al. | 257/416 |
| 5,818,035 A | 10/1998 | Krivanek et al. | 250/208.1 |
| 5,821,532 A | 10/1998 | Beaman et al. | 250/239 |
| 5,867,368 A | 2/1999 | Glenn | 361/783 |
| 5,907,178 A | 5/1999 | Baker et al. | 257/433 |
| 5,932,875 A | 8/1999 | Chung et al. | 250/239 |
| 5,986,317 A | 11/1999 | Wiese | 257/433 |
| 6,072,232 A | * 6/2000 | Li et al. | 257/680 |
| 6,130,448 A | 10/2000 | Bauer et al. | 257/222 |
| 6,172,361 B1 | 1/2001 | Holberg et al. | 250/239 |
| 6,184,514 B1 | 2/2001 | Rezende et al. | 250/208.1 |
| 6,191,359 B1 | * 2/2001 | Sengupta et al. | 174/52.3 |
| 6,266,197 B1 | 7/2001 | Glenn et al. | 359/819 |
| 6,342,406 B1 | * 1/2002 | Glenn et al. | 438/57 |

* cited by examiner

*Primary Examiner*—Stephone B. Allen
*Assistant Examiner*—Christopher W. Glass
(74) *Attorney, Agent, or Firm*—Gunnison, McKay & Hodgson, L.L.P.; Serge J. Hodson

(57) ABSTRACT

An image sensor package includes an image sensor having an active area, a window, and a window support in contact with the active area and in contact with the window. The window support entirely encloses, and thus protects, the active area of the image sensor. During use, radiation passes through the window, passes through the window support, and strikes the active area, which responds to the radiation. By forming the window and the window support to have a similar refractive index, the amount of reflected radiation is minimized thus enhancing the sensitivity of the image sensor package. Further, the window support completely fills the region between the window and the active area thus eliminating any possibility of moisture condensation within the image sensor package.

25 Claims, 4 Drawing Sheets

INTEGRALLY CONNECTED IMAGE SENSOR PACKAGES HAVING A WINDOW SUPPORT IN CONTACT WITH A WINDOW AND THE ACTIVE AREA

This application is related to Webster et al., commonly assigned and co-filed U.S. patent application Ser. No. 09/491,112, entitled "PROTECTED IMAGE SENSOR PACKAGE FABRICATION METHOD", which is herein incorporated by reference in its entirety.

FIELD OF THE INVENTION

The present invention relates generally to the packaging of electronic components. More particularly, the present invention relates to an image sensor package.

BACKGROUND OF THE INVENTION

Image sensors are well known to those of skill the art. An image sensor included an active area, which was responsive to electromagnetic radiation. To avoid obstructing or distorting the electromagnetic radiation which struck the active area of the image sensor, it was important to avoid contamination, e.g., from dust, of the active area.

Image sensors were fabricated from a silicon wafer. More particularly, a plurality of image sensors were formed in a single silicon wafer. The silicon wafer was singulated, sometimes called cut-up or diced, to separate the image sensors from one another. However, during this wafer singulation, silicon shards were generated. These silicon shards had a tendency to contaminate and scratch the active areas of the image sensors. As a result, image sensors were damaged or destroyed, which undesirably decreased the yield. However, to reduce cost, it is important to have a high yield.

The singulated image sensor was then used to fabricate an image sensor assembly. In this assembly, the image sensor was located within a housing, which supported a window. Radiation passed through the window and struck the active area of the image sensor, which responded to the radiation.

Beaman et al., U.S Pat. No. 5,821,532, which is herein incorporated by reference in its entirety, teaches an image sensor assembly. In the assembly, an image sensor was mounted to a printed circuit board. After the image sensor was mounted, a housing was mounted around the image sensor and to the print circuit board. This housing provided a hermetic like seal around the image sensor, while at the same time, supported a window above the image sensor.

As the art moves to smaller and lighter weight electronic devices, it becomes increasingly important that the size of the image sensor assembly used within these electronic devices is small. Disadvantageously, a conventional image sensor assembly required a housing to support the window and to hermetically seal the image sensor. However, this housing was relatively bulky and extended upwards from the printed circuit board a significant distance, e.g., 0.100 inches (2.54 mm) to 0.120 inches (3.05 mm) or more. As a result, the image sensor assembly was relatively large.

In addition, mounting this housing at the printed circuit board level was inherently labor intensive and added complexity to the manufacture of the image sensor assembly. In particular, the image sensor was exposed to the ambient environment up until the housing was mounted to the printed circuit board. Since the image sensor was sensitive to dust as well as other environmental factors, it was important to manufacture the image sensor assembly in a controlled environment such as a cleanroom. Otherwise, there was a risk of damaging or destroying the image sensor. Since neither of these alternatives are desirable and both are expensive, the art needs an image sensor assembly which is simple to manufacture so that the cost associated with the image sensor assembly is minimized.

In the event that moisture was trapped inside of the housing, defective operation or failure of the image sensor assembly was observed. More particularly, the moisture had a tendency to condense within the housing and on the interior surface of the window. Even if the housing later dried out, a stain was left on the window. In either event, electromagnetic radiation passing through the window was distorted or obstructed by either moisture condensation or stain, which resulted in defective operation or failure of the image sensor assembly.

For this reason, an important characteristic was the temperature at which condensation formed within the housing of image sensor assembly, i.e., the dew point of the image sensor assembly. In particular, it was important to have a low dew point to insure satisfactory performance of the image sensor assembly over a broad range of temperatures.

SUMMARY OF THE INVENTION

In accordance with the present invention, an image sensor package includes an image sensor having an active area, a window, and a window support in contact with the active area and in contact with the window. The window support entirely encloses, and thus protects, the active area of the image sensor.

During use, radiation is directed at the image sensor package. This radiation passes through the window, passes through the window support, and strikes the active area of the image sensor, which responds to the radiation. The window and the window support are transparent to the radiation.

In one embodiment, the refractive index of the window support is similar to the refractive index of the window. In this manner, the sensitivity of the image sensor package is improved compared to the prior art.

Recall that in the prior art, a housing was mounted around the image sensor and to the print circuit board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected. Since the electromagnetic radiation had to pass from air, through the window, and back through air to reach the active area of the image sensor in the prior art, a significant percentage of the electromagnetic radiation was reflected. This resulted in an overall loss of sensitivity of prior art image sensor assemblies.

In contrast, the window and the window support of the image sensor package in accordance with the present invention have a similar refractive index. Accordingly, the amount of reflected radiation is reduced compared to the prior art. This improves the sensitivity of the image sensor package compared to prior art image sensor assemblies.

Further, instead of having air between the window and the active area of the image sensor as in the prior art, the window support completely fills the region between the window and the active area. Advantageously, by eliminating the prior art cavity between the active area and the window, the possibility of moisture condensation within the cavity is also eliminated. Accordingly, the image sensor package does not have a dew point.

In contrast, prior art image sensor assemblies had a dew point, i.e., a temperature at which condensation formed within the housing, which enclosed the image sensor and supported the window. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since the image sensor package in accordance with the present invention does not have a dew point, the image sensor package operates satisfactorily over a broader range of temperatures and, more particularly, at lower temperatures than image sensor assemblies of the prior art. Further, since the image sensor package is formed without a cavity, there is no possibility that moisture will leak into the image sensor package. Accordingly, the reliability of the image sensor package is greater than that of the prior art.

Further, the housing of a prior art image sensor assembly was typically formed of ceramic, which was relatively expensive. Advantageously, the image sensor package in accordance with present invention eliminates the need for a housing of the prior art. Accordingly, the image sensor package is significantly less expensive to manufacture than an image sensor assembly of the prior art.

Further, since the window is attached directly to the image sensor by the window support, the image sensor package can be made relatively thin compared to a prior art image sensor assembly. To illustrate, a 0.039 inch (1.0 mm) or less thickness for the image sensor package is easily achievable.

In contrast, the prior art image sensor housing was relatively bulky and extended upwards from the printed circuit board a significant distance, e.g., 0.100 inches (2.54 mm) to 0.120 inches (3.05 mm) or more. Since the image sensor package in accordance with the present invention can be made relatively thin, the image sensor package is well suited for use with miniature lightweight electronic devices, which require thin and lightweight image sensor assemblies.

Also in accordance with the present invention, a method of forming an image sensor package includes applying a drop to an active area of an image sensor, and pressing a window into the drop to form a window support. By forming the drop with an apex at, or near, a center of the drop, the window initially contacts the apex of drop during pressing. As the window is pressed into the drop, the drop is squeezed by the window downwards towards the active area of the image sensor and outwards from the apex of the drop. Squeezing the drop in this manner avoids bubble formation, i.e., avoid entrapment of air under the window and within the window support. These bubbles would otherwise distort radiation passing through the window support.

In one embodiment, the image sensor is integrally connected to a plurality of image sensors as part of an image sensor substrate. In accordance with this embodiment, drops are applied to the active areas of the image sensors, and windows are pressed into these drops to form window supports on the active areas. The window supports are setup, e.g., cured, gelled, or made tacky.

The image sensor substrate is then singulated to form a plurality of image sensor packages. Of importance, the active areas of the image sensors are protected by the windows during singulation. More particularly, the windows protect the active areas from contamination and scratching during singulation, e.g., from silicon shards. As a result, damage or destruction of the image sensors is avoided. Accordingly, yield is increased and package cost is reduced compared to the prior art.

Further, the windows protect the active areas during subsequent processing of the image sensor package, e.g., during subsequent wire bonding and/or encapsulation and/or molding. More particularly, the windows protect the active areas from dust and contamination. Accordingly, after attachment of the windows to the image sensors, the image sensor packages can be stored or further packaged in any facility with or without a cleanroom.

Recall that in the prior art, the housing, which hermetically sealed the image sensor, was mounted directly to the larger substrate. Thus, to avoid damage or destruction of the image sensor, the image sensor had to be carefully stored and packaged in a cleanroom. Since the prior art requirement of carefully storing and packaging the image sensor in a cleanroom is eliminated, the cost associated with the image sensor package is reduced compared to the prior art.

Further, by forming a plurality of image sensor packages simultaneously, several advantages are realized. One advantage is that it is less labor intensive to handle and process a plurality of image sensor packages simultaneously rather than to handle and process each image sensor package on an individual basis. Another advantage is that usage of materials is more efficient when an array of image sensor packages is fabricated. By reducing labor and using less material, the cost associated with each image sensor package is minimized.

In one embodiment, to form an image sensor assembly, the image sensor package is further packaged. Advantageously, since the active area of the image sensor is protected by the window, the image sensor package can be further packaged using any one of the number of conventional packaging techniques. For example, the image sensor package is put into a flip chip, a leadframe, or a wirebonded image sensor assembly.

Further, the window is formed with a locking feature, which mechanically locks the window to the package body of the image sensor assembly. Since the window is mechanically locked to the package body, the window support can be formed with less structural integrity and adhesion to the window than otherwise would be required if the window support was entirely responsible for supporting the window.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

Figure 1:
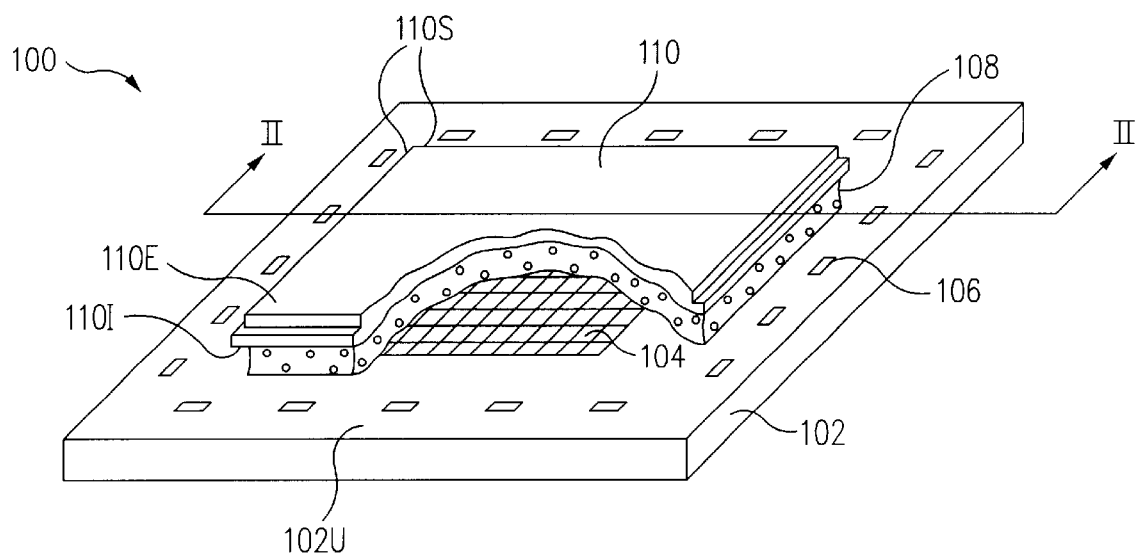
FIG. 1 is a perspective view, partially cutaway, of an image sensor package in accordance with the present invention.

In accordance with the present invention, an image sensor package 100 (FIGS. 1 and 2) includes an image sensor 102 having an active area 104, a window 110, and a window support 108 in contact with active area 104 and in contact with window 110. Window support 108 entirely encloses, and thus protects, active area 104 of image sensor 102.

During use, radiation is directed at image sensor package 100. This radiation passes through window 110, passes through window support 108, and strikes active area 104, which responds to the radiation. Window 110 and window support 108 are transparent to the radiation.

In one embodiment, the refractive index of window support 108 is similar to the refractive index of window 110. In this manner, the sensitivity of image sensor package 100 is improved compared to the prior art.

Recall that in the prior art, a housing was mounted around the image sensor and to the print circuit board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected. Since the electromagnetic radiation had to pass from air, through the window, and back through air to reach the active area of the image sensor in the prior art, a significant percentage of the electromagnetic radiation was reflected. This resulted in an overall loss of sensitivity of prior art image sensor assemblies.

In contrast, window 110 and window support 108 of image sensor package 100 have a similar refractive index. Accordingly, the amount of reflected radiation is reduced compared to the prior art. This improves the sensitivity of image sensor package 100 compared to prior art image sensor assemblies.

Further, instead of having air between the window and the active area of the image sensor as in the prior art, window support 108 completely fills the region between window 110 and active area 104. Advantageously, by eliminating the prior art cavity between the active area and the window, the possibility of moisture condensation within the cavity is also eliminated. Accordingly, image sensor package 100 does not have a dew point.

In contrast, prior art image sensor assemblies had a dew point, i.e., a temperature at which condensation formed within the housing which enclosed the image sensor and supported the window. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since image sensor package 100 does not have a dew point, image sensor package 100 operates satisfactorily over a broader range of temperatures than image sensor assemblies of the prior art. Further, since image sensor package 100 is formed without a cavity, there is no possibility that moisture will leak into image sensor package 100. Accordingly, the reliability of image sensor package 100 is greater than that of the prior art.

Further, the housing of a prior art image sensor assembly was typically formed of ceramic, which was relatively expensive. Advantageously, image sensor package 100 eliminates the need for a housing of the prior art. Accordingly, image sensor package 100 is significantly less expensive to manufacture than image sensor assemblies of the prior art.

Further, since window 110 is attached directly to image sensor 102 by window support 108, image sensor package 100 can be made relatively thin compared to a prior art image sensor assembly. To illustrate, a 0.039 inch (1.0 mm) or less thickness for image sensor package 100 is easily achievable.

In contrast, the prior art image sensor housing was relatively bulky and extended upwards from the printed circuit board a significant distance, e.g., 0.100 inches (2.54 mm) to 0.120 inches (3.05 mm) or more. Since image sensor package 100 can be made relatively thin, image sensor package 100 is well suited for use with miniature lightweight electronic devices, which require thin and lightweight image sensor assemblies.

Figure 6:
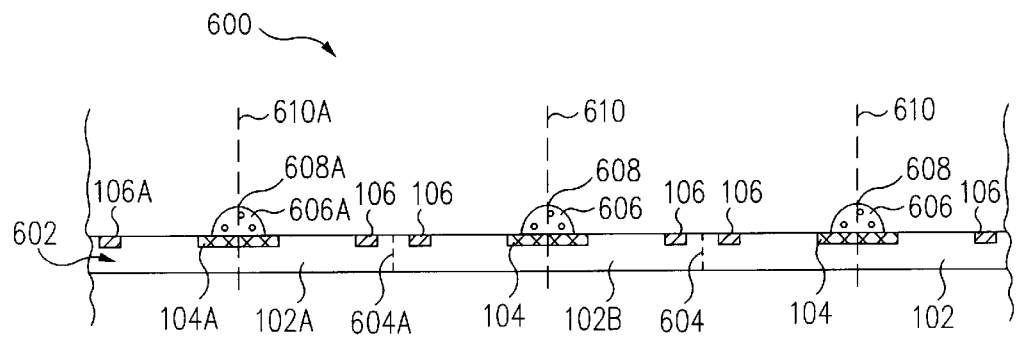
FIG. 6 is a cross-sectional view of a structure during the fabrication of a plurality of image sensor packages in accordance with the present invention.
Figure 7:
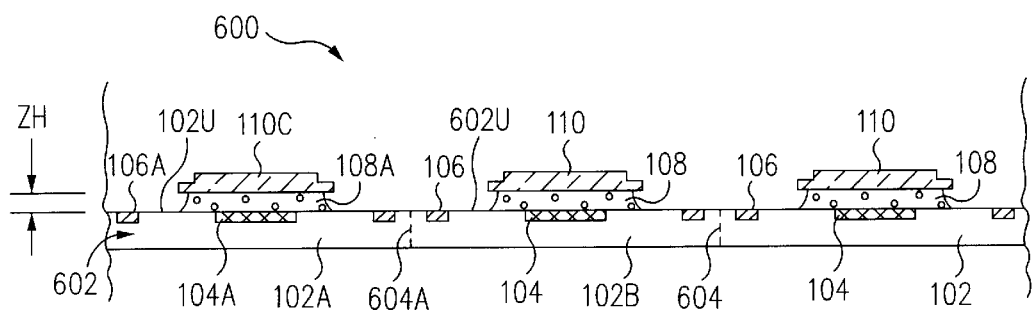
FIG. 7 is a cross-sectional view of the structure of FIG. 6 at a further stage of fabrication in accordance with the present invention.

Also in accordance with the present invention, referring now to FIG. 6 and 7, a method of forming an image sensor package includes applying a drop 606A to an active area 104A of an image sensor 102A, and pressing a window 110C into drop 606A to form a window support 108A. Image sensor 102A is integrally connected to a plurality of image sensors 102 as part of an image sensor substrate 602. Drops 606 are applied to active areas 104 of the other image sensors 102, and windows 110 are pressed into drops 606 to form window supports 108 on active areas 104. Window supports 108 are setup, e.g., cured, gelled, or made tacky.

Figure 2:
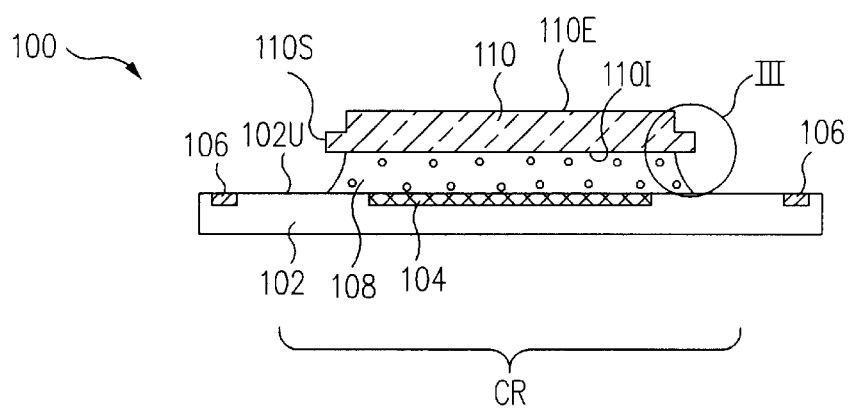
FIG. 2 is a cross-sectional view of the package along the line II—II of FIG. 1.

Image sensor substrate 602 is then singulated to form a plurality of image sensor packages 100 (FIGS. 1 and 2). Of importance, referring still to FIGS. 6 and 7, active areas 104 of image sensors 102 are protected by windows 110 during singulation. More particularly, windows 110 protect active areas 104 from contamination and scratching during singulation, e.g., from silicon shards. As a result, damage or destruction of image sensors 102 is avoided. Accordingly, yield is increased and package cost is reduced compared to the prior art.

Referring again to FIGS. 1 and 2, window 110 protects active area 104 during subsequent processing of image sensor package 100, e.g., during subsequent wire bonding and/or encapsulation and/or molding. More particularly, window 110 protects active area 104 from dust and contamination. Accordingly, after attachment of window 110 to image sensor 102, image sensor package 100 can be stored or further packaged in any facility with or without a cleanroom.

Recall that in the prior art, the housing, which hermetically sealed the image sensor, was mounted directly to the larger substrate. Thus, to avoid damage or destruction of the image sensor, the image sensor had to be carefully stored and packaged in a cleanroom. Since the prior art requirement of carefully storing and packaging the image sensor in a cleanroom is eliminated, the cost associated with image sensor package 100 is reduced compared to the prior art.

Further, by forming a plurality of image sensor packages 100 simultaneously, several advantages are realized. One advantage is that it is less labor intensive to handle and process a plurality of image sensor packages 100 simultaneously rather than to handle and process each image sensor package 100 on an individual basis. Another advantage is that usage of materials is more efficient when an array of image sensor packages 100 is fabricated. By reducing labor and using less material, the cost associated with each image sensor package 100 is minimized.

More particularly, FIG. 1 is a perspective view, partially cutaway, of an image sensor package 100 (hereinafter package 100) in accordance with the present invention. FIG. 2 is a cross-sectional view of package 100 along the line II—II of FIG. 1. Referring to FIGS. 1 and 2 together, package 100 includes an image sensor 102, sometimes called a sensor device. Image sensor 102 includes an active area 104, sometimes called an image array. Active area 104 is on an upper, e.g., first, surface 102U of image sensor 102. Generally, active area 104 is responsive to radiation, e.g., electromagnetic radiation, as is well known to those of skill in the art. For example, active area 104 is responsive to infrared radiation, ultraviolet light, and/or visible light. Illustratively, image sensor 102 is a CMOS image sensor device, a charge coupled device (CCD), a pyroelectric ceramic on CMOS device, or an erasable programmable read-only memory device (EPROM) although other image sensors are used in other embodiments.

Image sensor 102 further includes a plurality of bond pads 106 on upper surface 102U of image sensor 102. Bond pads 106 are connected to the internal circuitry of image sensor 102. Further, bond pads 106 defined a central region CR of upper surface 102U of image sensor 102 inwards of bond pads 106. Active area 104 is located within central region CR.

Formed on central region CR is a window support 108. More particularly, window support 108 contacts and entirely encloses active area 104 yet does not extend over bond pads 106. Generally, window support 108 is transparent to the radiation of interest, e.g., to the radiation to which active area 104 of image sensor 102 is responsive, as those of skill in the art will understand. In one particular embodiment, window support 108 is MasterSil product grade 151 silicone epoxy available from Master bond Inc. Of Hackensack, N.J.

Window support 108 is in contact with and secures a window 110 to upper surface 102U of image sensor 102. Window 110 includes an interior, e.g., first, surface 110I and an exterior, e.g., second, surface 110E opposite interior surface 110I. Interior surface 110I is secured to window support 108 and exterior surface 110E is exposed to the ambient environment. Window 110 further includes sides 110S which extend between exterior surface 110E and interior surface 110I.

In this embodiment, window support 108 contacts interior surface 110I only, or a central portion of interior surface 110I only, i.e., does not contact sides 110S. Further, window 110 overlies central region CR and does not overlie bond pads 106.

Window 110 is parallel to upper surface 102U of image sensor 102. More particularly, a plane defined by interior surface 110I (or exterior surface 110E) is parallel to a plane defined by upper surface 102U of image sensor 102.

Window 110 is transparent to the radiation of interest, e.g., to the radiation to which active area 104 of image sensor 102 is responsive, as those of skill the art will understand. In one particular embodiment, window 110 is optically transparent borosilicate glass.

Generally, the transmittance of window support 108 and window 110 is sufficient to allow the necessary minimum amount of radiation needed for the proper operation of image sensor 102 to pass through window support 108 and window 110.

During use, radiation is directed at package 100. This radiation passes through window 110, through window support 108 and strikes active area 104, which responds to the radiation as is well known to those of skill the art. However, in an alternative embodiment, active area 104 of image sensor 102 transmits radiation such as electromagnetic radiation. For example, image sensor 102 is a light emitting diode (LED) micro-display. In accordance with this embodiment, radiation transmitted by active area 104 passes through window support 108, through window 110, and emanates from package 100. For simplicity, in the above and following discussions, active area 104 as a receiver of radiation is set forth. However, in light of this disclosure, those of skill in the art will recognize that generally active area 104 can be a receiver of radiation, a transmitter of radiation, or a transceiver, i.e., a transmitter and a receiver, of radiation.

In one embodiment, the refractive index of window support 108 is similar to the refractive index of window 110. In this manner, the sensitivity of package 100 is improved compared to the prior art.

Recall that in the prior art, a housing was mounted around the image sensor and to the print circuit board. This housing supported a window above the image sensor. However, located between the window and the image sensor was air. Disadvantageously, air has a relatively low refractive index compared to the window. As those skilled in the art understand, as visible light or other electromagnetic radiation passes from a material having a high refractive index to a material having a low refractive index and vice versa, a significant percentage of the electromagnetic radiation is reflected. To illustrate, for a window having a refractive index of 1.52, at each window/air interface, approximately 4 percent of the electromagnetic radiation is reflected. Since the electromagnetic radiation had to pass from air, through the window, and back through air to reach the active area of the image sensor in the prior art, a significant percentage of the electromagnetic radiation was reflected. This resulted in an overall loss of sensitivity of prior art image sensor assemblies.

In contrast, window 110 and window support 108 of package 100 have a similar refractive index. Illustratively, the difference between the refractive index of window 110 and the refractive index of window support 108 is such that the amount of radiation reflected at the interface of window 110 and window support 108 is one percent or less. As an example, window 110 has a refractive index of 1.52 and window support 108 has a refractive index of 1.40. Accordingly, the amount of reflected radiation is reduced compared to the prior art. This improves the sensitivity of package 100 compared to prior art image sensor assemblies. In one embodiment, package 100 is 13% more sensitive to electromagnetic radiation than prior art image sensor assemblies.

Further, instead of having air between the window and the active area of the image sensor as in the prior art, window support 108 completely fills the region between window 110 and active area 104. In other words, package 100 is a cavityless package, i.e., package 100 does not have a cavity between window 110 and active area 104. Advantageously, by eliminating the prior art cavity between the active area and the window, the possibility of moisture condensation within the cavity is also eliminated. Accordingly, package 100 has no dew point.

In contrast, prior art image sensor assemblies had a dew point, i.e., a temperature at which condensation formed within the housing which enclosed the image sensor and supported the window. In general, moisture had a tendency to condense within the housing and on the interior surface of the window. To avoid this condensation, it was important to avoid subjecting the image sensor assembly to extreme low temperatures. Disadvantageously, this limited the temperature range over which the image sensor assembly would satisfactorily perform. Alternatively, the image sensor assembly was fabricated in a low humidity environment to avoid trapping moisture within the housing and was hermetically sealed by the housing to keep out moisture. This added complexity, which increased the cost of the image sensor assembly. Further, in the event that the hermetic seal of the housing failed, the image sensor was damaged or destroyed.

Since package 100 does not have a dew point, package 100 operates satisfactorily over a broader range of temperatures and, more particularly, at lower temperatures than image sensor assemblies of the prior art. Further, since package 100 is a cavityless package, there is no possibility that moisture will leak into package 100. Accordingly, the reliability of package 100 is greater than that of the prior art.

Further, the housing of a prior art image sensor assembly was typically formed of ceramic, which was relatively expensive. Advantageously, package 100 in accordance with present invention eliminates the need for a housing of the prior art. Accordingly, package 100 is significantly less expensive to manufacture than image sensor assemblies of the prior art.

Further, since window 110 is attached directly to image sensor 102 by window support 108, image sensor package 100 can be made relatively thin compared to a prior art image sensor assembly. To illustrate, a 0.039 inch (1.0 mm) or less thickness for image sensor package 100 is easily achievable.

In contrast, the prior art image sensor housing was relatively bulky and extended upwards from the printed circuit board a significant distance, e.g., 0.100 inches (2.54 mm) to 0.120 inches (3.05 mm) or more. Since package 100 can be made relatively thin, package 100 is well suited for use with miniature lightweight electronic devices, which require thin and lightweight image sensor assemblies.

Figure 3:
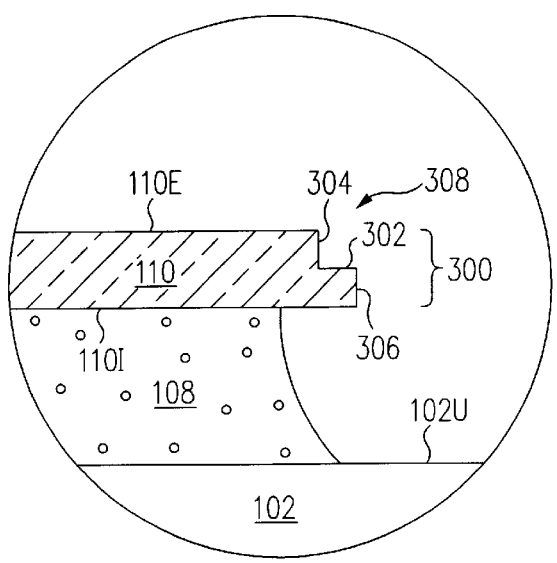
FIG. 3 is an enlarged cross-sectional view of the region III of the package of FIG. 2.

FIG. 3 is an enlarged cross-sectional view of the region III of package 100 of FIG. 2. Referring now to FIG. 3, window 110 includes a locking feature 300 along the periphery of window 110. Generally, locking feature 300 mechanically locks window 110 to the package body, e.g., to plastic or liquid encapsulant, as discussed in greater detail below in reference to FIGS. 8, 9 and 10.

Locking feature 300 is formed along sides 110S (FIGS. 1, 2) of window 110. In this embodiment, locking feature 300 is shaped as a ledge, sometimes called a step, which extends around the periphery of window 110. More particularly, locking feature 300 includes a rectangular ring-like shelf 302, e.g., a third surface, which extends around exterior surface 110E. Shelf 302 is located on a plane parallel to, and located between, a plane defined by exterior surface 110E and a plane defined by interior surface 110I.

Step sides 304 extend between exterior surface 110E and shelf 302 and step sides 306 extend between shelf 302 and interior surface 110I. In this embodiment, step sides 304, 306, are perpendicular to planes defined by exterior surface 110E, interior surface 110I, and shelf 302.

Of importance, shelf 302 and step sides 304 define a pocket 308. As discussed in greater detail below with reference to FIGS. 8, 9 and 10, the package body extends into and fills pocket 308 thus mechanically locking window 110 into place. Although locking feature 300 is illustrated as a ledge in FIG. 3, in light of this disclosure, those of skill in the art will understand that other locking features can be used. Further, in one embodiment, window 110 does not include a locking feature.

Figure 4:
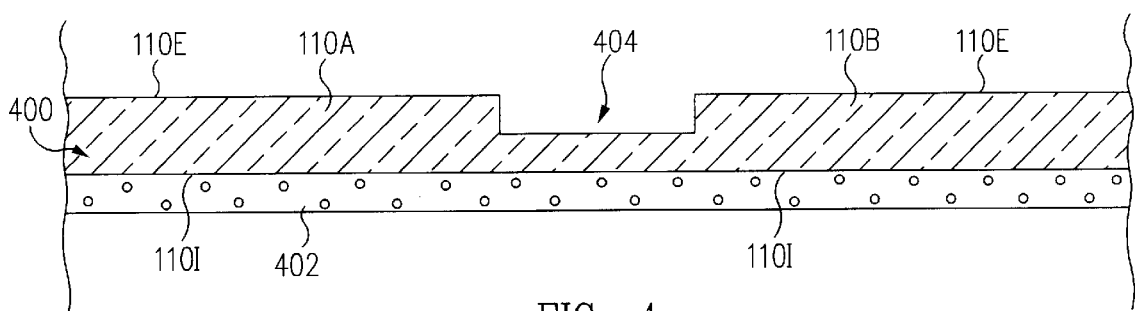
FIG. 4 is a cross-sectional view of a single sheet during the formation of a plurality of windows in accordance with the present invention.

In this embodiment, window 110 including locking feature 300 is fabricated simultaneously with a plurality of windows 110 from a single sheet. FIG. 4 is a cross-sectional view of a single sheet 400 during the formation of a plurality of windows 110 including a first window 110A and a second window 110B. Initially, sheet 400 is attached to a support 402 such as a sticky tape used in wafer dicing as is well known to those of skill in the art. A series of shallow wide cuts including a first shallow wide cut 404 are made in sheet 400, for example, with a wide saw blade. Of importance, shallow wide cut 404 only scores sheet 400 and does not cut through sheet 400. Illustratively, shallow wide cut 404 is 0.015 inches (0.38 mm) wide and cuts halfway through sheet 400. The other shallow wide cuts are similar to shallow wide cut 404.

Figure 5:
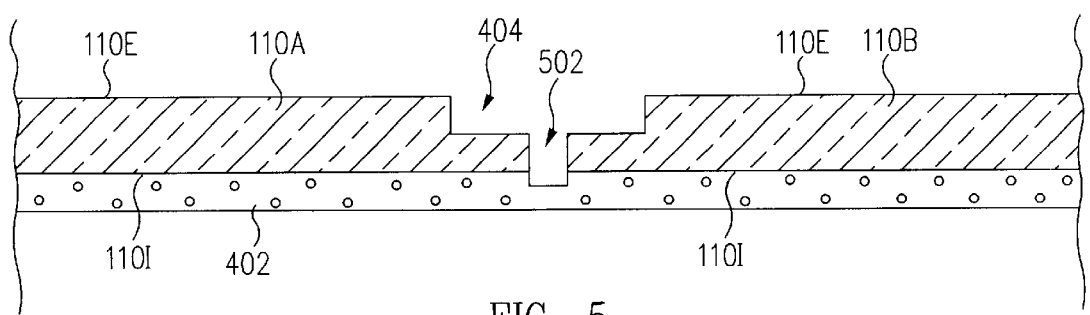
FIG. 5 is a cross-sectional view of the sheet of FIG. 4 at a later stage of fabrication.

FIG. 5 is a cross-sectional view of sheet 400 of FIG. 4 at a later stage of fabrication. After the series of shallow wide cuts including shallow wide cut 404 are made, a series of deep narrow cuts including a deep narrow cut 502 are made, for example, with a narrow saw blade. As shown in FIG. 5, deep narrow cut 502 is made in the approximate center of shallow wide cut 404. Deep narrow cut 502 cuts all the way through sheet 400 thus singulating window 110A from window 110B. Windows 110A, 110B are held by support 402. Illustratively, deep narrow cut 502 is 0.008 inches (0.20 mm) wide. The other deep narrow cuts are made in the approximate centers of the other corresponding shallow wide cuts in a similar manner so are not discussed further to avoid detracting from the principals of the invention.

Advantageously, the shallow wide cuts and the deep narrow cuts made in sheet 400 are desirably rough cuts to enhance the locking ability of locking feature 300. Since rough cuts are desirable, the shallow wide cuts and the deep narrow cuts can be made using a high-speed cutting process.

In contrast, for aesthetic, safety and other reasons, prior art windows for image sensor assemblies were formed with finished cuts, i.e., smooth cuts. In other words, chipped, jagged or damaged windows were unacceptable for use in prior art image sensor assemblies and were discarded. Further, to form windows with the finished cuts, a slow-speed cutting process was used. For these reasons, windows 110 in accordance with the present invention are fabricated at a lower cost than windows of prior art image sensor assemblies.

FIG. 6 is a cross-sectional view of a structure 600 during the fabrication of a plurality of packages 100 (FIGS. 1, 2) in accordance with the present invention. Structure 600 includes an image sensor substrate 602 such as a silicon wafer. Image sensor substrate 602 includes a plurality of image sensors 102 integrally connected together. Image sensors 102 include active areas 104 formed on an upper, e.g., first, surface 602U of image sensor substrate 602. Image sensors 102 further include bond pads 106 on upper surface 602U of image sensor substrate 602. Bond pads 106 are connected to the internal circuitry of image sensors 102.

To illustrate, a first image sensor 102A of the plurality of image sensors 102 includes a first active area 104A of the plurality of active areas 104. Image sensor 102A also includes a first bond pad 106A of the plurality of bond pads 106. The other image sensors 102 include active areas 104 and bond pads 106 in a similar manner.

Image sensors 102 are integrally connected together in an array format. Each of image sensors 102 is delineated by a singulation street 604, which is located between adjacent image sensors 102. For example, a first singulation street 604A of the plurality of singulation streets 604 delineates first image sensor 102A from a second image sensor 102B of the plurality of image sensors 102. The other image sensors 102 are similarly delineated from adjacent image sensors 102 by corresponding singulation streets 604.

As shown in FIG. 6, drops 606 are applied to each active area 104 such that drops 606 are on active areas 104. To illustrate, a first drop 606A of the plurality of drops 606 is applied to, and is on, active area 104A. In one embodiment, drop 606A is applied by pin transfer of an appropriate bonding material, such as adhesive. More particularly, a pin is dipped in a bath of the bonding material, the pin is removed from the bath such that the tip of the pin is coated with the bonding material, and the tip of the pin is moved adjacent to active area 104A. The bonding material is transferred from the tip of the pin to active area 104A to form drop 606A. However, in light of this disclosure, those of skill in the art will recognize that other techniques can be used to apply drop 606A to active area 104A. For example, drop 606A is formed using a syringe and/or screen printing techniques. The other drops 606 are formed in a similar manner simultaneously or, alternatively, one at a time.

Of importance, drop 606A has an apex 608A near, or at, a horizontal center 610A of drop 606A. The other drops 606 have corresponding apexes 608 near corresponding horizontal centers 610 in a similar manner.

FIG. 7 is a cross-sectional view of structure 600 at a further stage of fabrication in accordance with the present invention. Referring now to FIGS. 6 and 7 together, windows 110 are pressed into corresponding drops 606 to form corresponding window supports 108. For example, a pick and place machine removes windows 110 from support 402 (FIG. 5) and presses windows 110 into corresponding drops 606 to form corresponding window supports 108.

To illustrate, a first window 110C of the plurality of windows 110 is pressed into drop 606A to form window support 108A. Of importance, since drop 606A is formed to have an apex 608A, window 110C initially contacts apex 608A. As window 110C is pressed into drop 606A, drop 606A is squeezed by window 110C downwards, e.g., in a first direction, towards active area 104A and outwards from apex 608A. Squeezing drop 606A in this manner avoids bubble formation, i.e., avoids entrapment of air under window 110C and within window support 108A. These bubbles would otherwise distort radiation passing through window support 108A.

Further, drop 606A has a volume sufficient to have window support 108A entirely cover active area 104A of image sensor 102A after window 110C is pressed into place. However, drop 606A has a volume insufficient to have window support 108A extend over any of bond pads 106. In one embodiment, drop 606A is formed within active area 104A and is squeezed such that window support 108A entirely covers active area 104A after window 110C is pressed into place.

Advantageously, by pressing window 110C into drop 606A in the above manner, window 110C is essentially parallel to upper surface 102U of image sensor 102A. Further, a distance ZH, sometimes called the Z height, between window 110C and image sensor 102A is precisely controlled to within tight tolerance.

In the prior art, the window was placed on a shelf of the housing after the housing was fabricated. Since a significant tolerance was associated with the window placement, the distance between the window and the image sensor had significant variations from assembly to assembly. However, to insure optimum operation of the image sensor, it is important that the distance between the window and image sensor be precise. Since the tolerance in this distance is reduced in package 100, the performance of package 100 is superior to that the prior art.

Although the placement of window 110C into drop 606A is described above, it is understood that the other windows 110 are placed into the other corresponding drops 606 to form the other corresponding window supports 108 in a similar manner, one at a time or, alternatively, simultaneously. After windows 110 are placed into corresponding drops 606, window supports 108 are cured. For example, window supports 108 are cured with ultraviolet light or heat. Further, instead of being cured, window supports 108 can be gelled or made tacky. Generally, window supports 108 are setup, e.g., cured, gelled or made tacky. As discussed further below in reference to FIGS. 8, 9 and 10, windows 110 are held in place by window supports 108 in combination with the package body. Accordingly, window supports 108 can be formed with less structural integrity and adhesion to windows 110 than otherwise would be required if window supports 108 were entirely responsible for supporting windows 110.

Image sensor substrate 602 is singulated along singulation streets 604 to form a plurality of image sensor packages 100 (FIGS. 1 and 2). Singulation is accomplished using any one of a number of conventional singulation techniques, e.g., by laser cutting or mechanical sawing through image sensor substrate 602.

Of importance, active areas 104 of image sensors 102 are protected by windows 110 during singulation. More particularly, windows 110 protect active areas 104 from contamination and scratching during singulation, e.g., from silicon shards. As a result, damage or destruction of image sensors 102 is avoided. Accordingly, yield is increased and package cost is reduced compared to the prior art.

Further, windows 110 protect active areas 104 during subsequent processing of package 100, e.g., during subsequent wire bonding and/or encapsulation and/or molding. More particularly, windows 110 protect active areas 104 from dust and contamination. Accordingly, after attachment of windows 110 to image sensors 102, structure 600 and, after singulation of image sensor substrate 602, packages 100 can be stored or further packaged in any facility with or without a cleanroom.

Recall that in the prior art, the housing, which hermetically sealed the image sensor, was mounted directly to the larger substrate. Thus, to avoid damage or destruction of the image sensor, the image sensor had to be carefully stored and packaged in a cleanroom. Since the prior art requirement of carefully storing and packaging the image sensor in a cleanroom is eliminated, the cost associated with package 100 is reduced compared to the prior art.

Further, by forming a plurality of packages 100 simultaneously, several advantages are realized. One advantage is that it is less labor intensive to handle and process a plurality of packages 100 simultaneously rather than to handle and process each package 100 on an individual basis. Another advantage is that usage of materials is more efficient when an array of packages 100 is fabricated. By reducing labor and using less material, the cost associated with each package 100 is minimized. However, in light of this disclosure, those of skill in the art will recognize that packages 100 can also be manufactured on an individual basis, if desired. For example, window 110 is attached by window support 108 after image sensor 102 is die attached and/or wire bonded.

In one embodiment, after singulation of image sensor substrate 602, package 100 is further packaged. Advantageously, since active area 104 of image sensor 102 is protected by window 110, package 100 can be further packaged using any one of a number of conventional packaging techniques, e.g., standard molding and/or liquid encapsulation techniques. For example, package 100 is put into a flip chip image sensor assembly such as that illustrated in FIG. 8, a leadframe image sensor assembly such as that illustrated in FIG. 9 or a wirebonded image sensor assembly such as that illustrated in FIG. 10.

Figure 8:
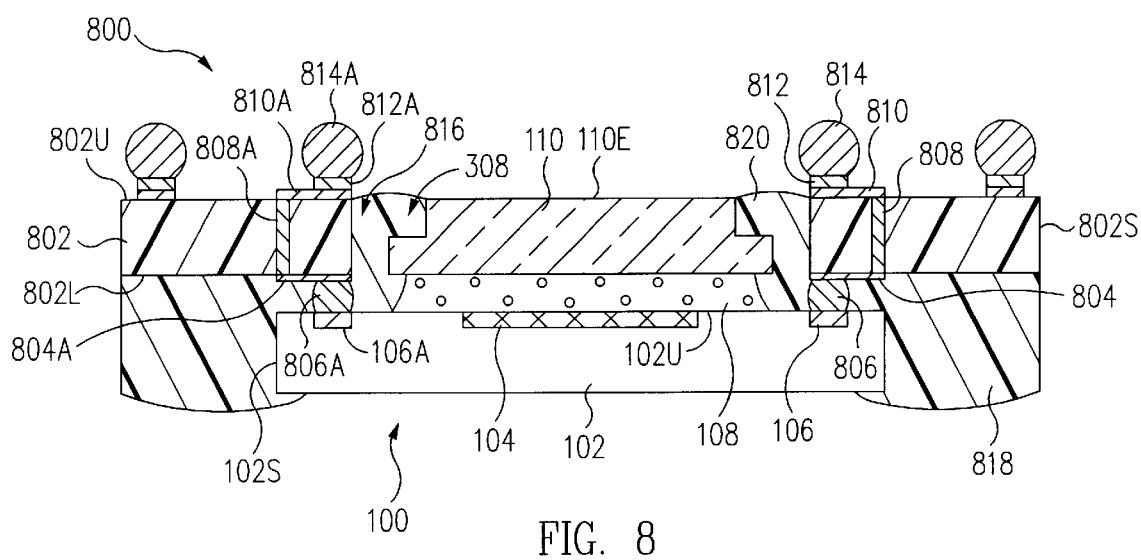
FIG. 8 is a cross-sectional view of a flip chip image sensor assembly in accordance with one embodiment of the present invention.

FIG. 8 is a cross-sectional view of a flip chip image sensor assembly 800 (hereinafter assembly 800) in accordance with one embodiment of the present invention. Referring to FIG. 8, assembly 800 includes a substrate 802. To illustrate, substrate 802 is a printed circuit board or, alternatively, is tape, as those of skill the art will understand.

Substrate 802 includes a plurality of electrically conductive traces 804 formed on a lower, e.g., first, surface 802L of substrate 802. Bond pads 106 are electrically connected to corresponding traces 804 by corresponding electrically conductive bumps 806. Traces 804 are electrically connected to corresponding electrically conductive vias 808 which extend from lower surface 802L to an upper, e.g., second, surface 802U of substrate 802 opposite lower surface 802L. Vias 808 are electrically connected to corresponding electrically conductive traces 810 on upper surface 802U of substrate 802. Formed on traces 810 are corresponding electrically conductive pads 812. Formed on pads 812 are corresponding electrically conductive interconnection balls 814 such as solder balls. Interconnection balls 814 are used to electrically connect assembly 800 to a larger substrate (not shown) such as a printed circuit mother board.

To illustrate, a first bond pad 106A of the plurality of bond pads 106 is electrically connected to a first trace 804A of the plurality of traces 804 by a first bump 806A of the plurality of bumps 806. Trace 804A is electrically connected to a first via 808A of the plurality of vias 808. Via 808A is electrically connected to a first trace 810A of the plurality of traces 810. A first pad 812A of the plurality of pads 812 is formed on trace 810A. Formed on pad 812A is a first interconnection ball 814A of the plurality of interconnection balls 814.

As set forth above, an electrically conductive pathway between bond pad 106A and interconnection ball 814A is formed by bump 806A, trace 804A, via 808A, trace 810A and pad 812A. The other bond pads 106, bumps 806, traces 804, vias 808, traces 810, pads 812 and interconnection balls 814 are electrically connected to one another in a similar fashion so are not discussed further to avoid detracting from the principals of the invention.

Although a particular electrically conductive pathway between interconnection ball 814A and bond pad 106A is described above, in light of this disclosure, it is understood that other electrically conductive pathways can be formed. For example, substrate 802 is a multi-layered laminated substrate and, instead of straight-through vias 808, a plurality of electrically conductive traces on various layers in substrate 802 are interconnected by a plurality of electrically conductive vias to form the electrical interconnections between traces 804 and 810.

As a further example, vias 808 extend along sides 802S of substrate 802 and traces 804 and 810 extend to sides 802S. As another alternative, interconnection balls 814 are distributed in an array format to form a ball grid array type package. Alternatively, interconnection balls 814 are not formed, e.g., to form a metal land array type package or a leadless chip carrier (LCC) package. Other electrically conductive pathway modifications will be obvious to those of skill in the art.

Substrate 802 includes a central aperture 816. Window 110 is located within, or is located adjacent to, central aperture 816. In particular, exterior surface 110E of window 110 is exposed through aperture 816. During use, radiation is directed at assembly 800. This radiation passes through window 110, through window support 108, and strikes active area 104. Active area 104 responds to this radiation as is well known to those of skill the art.

Assembly 800 further includes a package body 818. Package body 818 is an electrically insulating material and electrically protects, e.g., prevents shorting of, and environmentally protects, e.g., from moisture, the various electrically conductive structures of assembly 800. In addition, package body 818 provides mechanical strength to assembly 800 and, in particular, minimizes failure of bumps 806 and the associated detachment of image sensor 102 from substrate 802.

In this embodiment, package body 818 encloses upper surface 102U and sides 102S of image sensor 102, bond pads 106, lower surface 802L and central aperture 816 of substrate 802, traces 804, bumps 806 and window support 108. Further, package body 818, in combination with window support 108, mechanically locks window 110 in place. In particular, package body 818 includes an exterior locking feature 820, which fills pocket 308 of window 110, thus mechanically locking window 110 in place. In one embodiment, package body 818 including exterior locking feature 820 is integral, i.e., is one piece and not a plurality of single pieces connected together. In this embodiment, package body 818 leaves exposed exterior surface 110E of window 110, i.e., package body 818 does not contact or cover exterior surface 110E.

Package body 818 is formed of any one of a number of conventional packaging materials. For example, package body 818 is formed from a plastic encapsulant or, alternatively, a liquid encapsulant.

Figure 9:
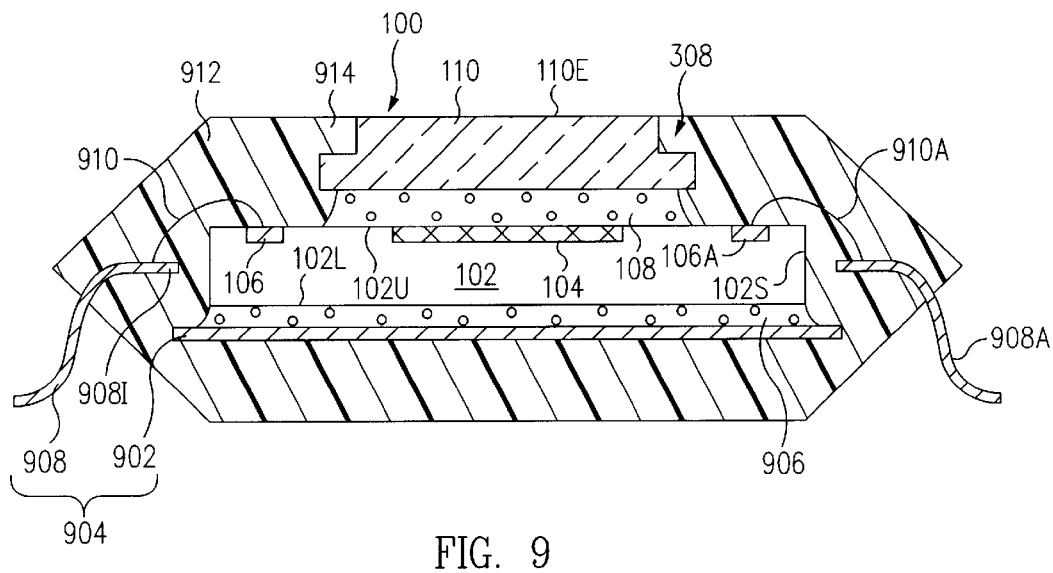
FIG. 9 is a cross-sectional view of a leadframe image sensor assembly in accordance with an alternative embodiment of the present invention.

FIG. 9 is a cross-sectional view of a leadframe image sensor assembly 900 (hereinafter assembly 900) in accordance with an alternative embodiment of the present invention. Referring now to FIG. 9, a lower, e.g., second, surface 102L of image sensor 102 is attached to a die attach pad 902 of a leadframe 904. For example, lower surface 102L is attached to die attach pad 902 with adhesive 906.

Leadframe 904 further includes a plurality of leads 908. Bond pads 106 are electrically connected to corresponding leads 908 by corresponding bond wires 910. For example, a first bond pad 106A of the plurality of bond pads 106 is electrically connected to a first lead 908A of the plurality of leads 908 by a first bond wires 910A of the plurality of bond wires 910. The other bond pads 106 are electrically connected to the other corresponding leads 908 by the other corresponding bond wires 910 and similar fashion so are not discussed further.

Assembly 900 further includes a package body 912. Package body 912 is an electrically insulating material and electrically protects, e.g., prevents shorting of, and environmentally protects, e.g., from moisture, the various electrically conductive structures of assembly 900.

Package body 912 encloses upper surface 102U and sides 102S of image sensor 102, bond pads 106, bond wires 910, die attach pad 902, inner ends 908I of leads 908, and window support 108. Further, package body 912, in combination with window support 108, mechanically locks window 110 in place. In particular, package body 912 includes an exterior locking feature 914 which fills pocket 308 of window 110, thus mechanically locking window 110 in place. In one embodiment, package body 912 including exterior locking feature 914 is integral. In this embodiment, package body 912 leaves exposed exterior surface 110E of window 110, i.e., package body 912 does not contact or covered exterior surface 110E.

Package body 912 is formed of any one of a number of conventional packaging materials. For example, package body 912 is formed from a plastic encapsulant or, alternatively, a liquid encapsulant.

Figure 10:
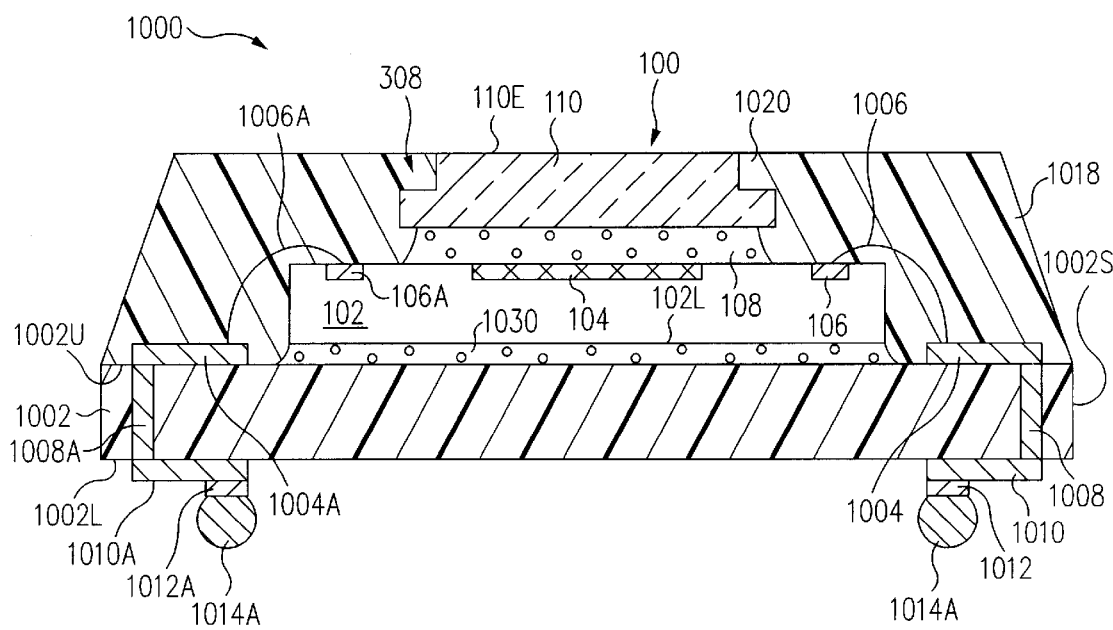
FIG. 10 is a cross-sectional view of a wirebonded image sensor assembly in accordance with yet another alternative embodiment of the present invention.

FIG. 10 is a cross-sectional view of a wirebonded image sensor assembly 1000 (hereinafter assembly 1000) in accordance with yet another alternative embodiment of the present invention. Referring to FIG. 10, assembly 1000 includes a substrate 1002. To illustrate, substrate 1002 is a printed circuit board, ceramic, or tape, although other materials are used in other embodiments. Lower surface 102L of image sensor 102 is attached to an upper, e.g., first, surface 1002U of substrate 1002, for example, with adhesive 1030.

Substrate 1002 includes a plurality of electrically conductive traces 1004 formed on upper surface 1002U of substrate 1002. Bond pads 106 are electrically connected to corresponding traces 1004 by corresponding electrically conductive bond wires 1006. Traces 1004 are electrically connected to corresponding electrically conductive vias 1008 which extend from upper surface 1002U to a lower, e.g., second, surface 1002L of substrate 1002 opposite upper surface 1002U. Vias 1008 are electrically connected to corresponding electrically conductive traces 1010 on lower surface 1002L of substrate 1002. Formed on traces 1010 are corresponding electrically conductive pads 1012. Formed on pads 1012 are corresponding electrically conductive interconnection balls 1014 such as solder balls. Interconnection balls 1014 are used to electrically connect assembly 1000 to a larger substrate (not shown) such as a printed circuit mother board.

To illustrate, a first bond pad 106A of the plurality of bond pads 106 is electrically connected to a first trace 1004A of the plurality of traces 1004 by a first bond wire 1006A of the plurality of bond wires 1006. Trace 1004A is electrically connected to a first via 1008A of the plurality of vias 1008. Via 1008A is electrically connected to a first trace 1010A of the plurality of traces 1010. A first pad 1012A of the plurality of pads 1012 is formed on trace 1010A. Formed on pad 1012A is a first interconnection ball 1014A of the plurality of interconnection balls 1014.

As set forth above, an electrically conductive pathway between bond pad 106A and interconnection ball 1014A is formed by bond wire 1006A, trace 1004A, via 1008A, trace 1010A and pad 1012A. The other bond pads 106, bond wires 1006, traces 1004, vias 1008, traces 1010, pads 1012 and interconnection balls 1014 are electrically connected to one another in a similar fashion so are not discussed further to avoid detracting from the principals of the invention.

Although a particular electrically conductive pathway between interconnection ball 1014A and bond pad 106A is described above, in light of this disclosure, it is understood that other electrically conductive pathways can be formed. For example, substrate 1002 is a multi-layered laminated substrate and, instead of straight-through vias 1008, a plurality of electrically conductive traces on various layers in substrate 1002 are interconnected by a plurality of electrically conductive vias to form the electrical interconnections between traces 1004 and 1010.

As a further example, vias 1008 extend along sides 1002S of substrate 1002 and traces 1004 and 1010 extend to sides 1002S. As another alternative, interconnection balls 1014 are distributed in an array format to form a ball grid array type package. Alternatively, interconnection balls 1014 are not formed, e.g., to form a metal land array type package or a leadless chip carrier (LCC) package. Other electrically conductive pathway modifications will be obvious to those of skill in the art.

Assembly 1000 further includes a package body 1018. Package body 1018 is an electrically insulating material and electrically protects, e.g., prevents shorting of, and environmentally protects, e.g., from moisture, the various electrically conductive structures of assembly 1000.

In this embodiment, package body 1018 encloses upper surface 102U of image sensor 102, bond pads 106, upper surface 1002U of substrate 1002, traces 1004, bond wires 1006 and window support 108. Further, package body 1018, in combination with window support 108, mechanically locks window 110 in place. In particular, package body 1018 includes an exterior locking feature 1020 which fills pocket 308 of window 110, thus mechanically locking window 110 in place. In one embodiment, package body 1018 including exterior locking feature 1020 is integral. In this embodiment, package body 1018 leaves exposed exterior surface 110E of window 110, i.e., package body 1018 does not contact or cover exterior surface 110E.

Package body 1018 is formed of any one of a number of conventional packaging materials. For example, package body 1018 is formed from a plastic encapsulant or, alternatively, a liquid encapsulant.

FIGS. 8, 9 and 10 are examples of image sensor assemblies, which incorporate package 100 in accordance with present invention. In light of this disclosure, those of skill the art will understand that other image sensor assemblies, which incorporate package 100, can be fabricated.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A structure comprising:
   an image sensor substrate comprising image sensors integrally connected together, said image sensors including an image sensor, said image sensor having an active area;
   a window; and
   a window support in contact with said active area and in contact with said window.

2. The structure of claim 1 wherein said image sensor comprises a first surface, said structure further comprising bond pads on said first surface, said bond pads defining a central region of said first surface inwards of said bond pads, said active area being located within said central region.

3. The structure of claim 2 wherein said window support is formed on said central region.

4. The structure of claim 2 wherein said window support entirely encloses said active area and does not extend over any of said bond pads.

5. The structure of claim 2 further comprising:
   a substrate; and
   electrically conductive traces on a first surface of said substrate, a first bond pad of said bond pads being electrically connected to a first trace of said electrically conductive traces.

6. The structure of claim 5 further comprising electrically conductive interconnection balls on a second surface of said substrate, said first bond pad being electrically connected to a first interconnection ball of said electrically conductive interconnection balls.

7. The structure of claim 2 further comprising a leadframe comprising electrically conductive leads, a first bond pad of said bond pads being electrically connected to a first lead of said electrically conductive leads.

8. The structure of claim 1 wherein said active area is a receiver, transmitter or transceiver of radiation, said window support being transparent to said radiation.

9. The structure of claim 8 wherein said window is transparent to said radiation.

10. The structure of claim 1 wherein said window has a first surface and a second surface, said first surface being secured to said window support.

11. The structure of claim 10 wherein said second surface is exposed to an ambient environment.

12. The structure of claim 10 wherein said window further comprises sides extending between said first surface and said second surface, said window further comprising a locking feature formed along said sides.

13. The structure of claim 12 wherein said locking feature is a step.

14. The structure of claim 12 wherein said locking feature includes a shelf extending around said second surface.

15. The structure of claim 14 wherein said shelf is located on a plane parallel to, and located between, a plane defined by said first surface and a plane defined by said second surface.

16. The structure of claim 15 wherein step sides extend between said second surface and said shelf, said shelf and said step sides defining a pocket.

17. The structure of claim 16 further comprising a package body extending into and filling said pocket.

18. The structure of claim 17 wherein said package body in combination with said window support mechanically locks said window in place.

19. The structure of claim 1 wherein a refractive index of said window support approximately equal to a refractive index of said window.

20. The structure of claim 1 wherein said window support completely fills a region between said active area and said window.

21. The structure of claim 20 wherein said structure is a cavityless package.

22. The structure of claim 21 wherein said cavityless package has no dew point.

23. A structure comprising:
   an image sensor substrate comprising image sensors integrally connected together, said image sensors including a first image sensor, said first image sensor having an active area;
   a window comprising:
      a first surface;
      a second surface;
      sides extending between said first surface and said second surface; and
      a locking feature formed along said sides; and
   a window support in contact with said active area and in contact with said first surface of said window.

24. A structure comprising:
   an image sensor having an active area;
   a window comprising:
      a first surface;
      a second surface;
      a shelf extending around said second surface; and
      step sides extending between said second surface and said shelf, said shelf and said step sides defining a pocket;
   a window support in contact with said active area and in contact with said first surface of said window; and
   a package body extending into and filling said pocket.

25. A structure comprising:
   an image sensor selected from the group consisting of a CMOS image sensor, a charge coupled device, a pyroelectric ceramic on CMOS and an erasable programmable read-only memory device, said image sensor having an active area and bond pads;
   a window; and
   a window support in contact with said active area and in contact with said window, wherein said window support entirely encloses said active area and does not extend over any of said bond pads.

* * * * *